US010794255B2

(12) United States Patent
Papadimitriou et al.

(10) Patent No.: US 10,794,255 B2
(45) Date of Patent: Oct. 6, 2020

(54) APPARATUS FOR UTILIZING WASTE HEAT OF AN INTERNAL COMBUSTION ENGINE

(71) Applicant: GF Casting Solutions AG, Schaffhausen (CH)

(72) Inventors: Ilias Papadimitriou, Schaffhausen (CH); Christian Graf, Iznang (DE)

(73) Assignee: GF CASTING SOLUTIONS AG, Schaffhausen (CH)

( * ) Notice: Subject to any disclaimer, the term of this patent is extended or adjusted under 35 U.S.C. 154(b) by 13 days.

(21) Appl. No.: 16/224,832

(22) Filed: Dec. 19, 2018

(65) Prior Publication Data
US 2019/0195109 A1 Jun. 27, 2019

(30) Foreign Application Priority Data
Dec. 22, 2017 (EP) .................................... 17209969

(51) Int. Cl.
F01N 5/02 (2006.01)
F01N 13/18 (2010.01)
F01N 13/10 (2010.01)
F01N 3/04 (2006.01)
F01N 13/08 (2010.01)
(Continued)

(52) U.S. Cl.
CPC ............. F01N 5/025 (2013.01); F01N 3/046 (2013.01); F01N 13/08 (2013.01); F01N 13/10 (2013.01); F01N 13/14 (2013.01); F01N 13/141 (2013.01); F01N 13/1861 (2013.01); F01N 13/1888 (2013.01); F02G 5/04 (2013.01); H01L 35/30 (2013.01); F01N 2240/04 (2013.01)

(58) Field of Classification Search
CPC ........ F01N 5/025; F01N 13/14; F01N 13/141; F01N 13/08; F01N 3/046; F01N 13/10; F01N 13/1888; F01N 13/1861; F01N 2240/04; F01N 3/02; F01N 13/102; H01L 35/30; F02G 5/04
USPC ........ 60/605.1–612, 320, 321, 274; 29/527.5
See application file for complete search history.

(56) References Cited

U.S. PATENT DOCUMENTS

2009/0025772 A1* 1/2009 Dannoux ................ F01N 5/025
136/205
2012/0060775 A1* 3/2012 Aixala .................... F01N 5/025
123/2
(Continued)

FOREIGN PATENT DOCUMENTS

DE 102015205898 A1 4/2016
EP 2180534 A1 4/2010
(Continued)

Primary Examiner — Hoang M Nguyen
(74) Attorney, Agent, or Firm — Leydig, Voit & Mayer, Ltd.

(57) ABSTRACT

An apparatus for utilizing waste heat of an internal combustion engine includes an exhaust gas manifold and a thermoelectric element. The thermoelectric element is configured to generate an electric voltage as a result of a temperature difference between a side facing away from the exhaust gas manifold and an opposite side. The thermoelectric element is arranged on the exhaust gas manifold. The apparatus additionally includes a cooling element arranged on the thermoelectric element on the side facing away from the exhaust gas manifold. The cooling element has at least one cooling passage configured to provide for the throughflow of a fluid.

18 Claims, 4 Drawing Sheets

(51) Int. Cl.
*F01N 13/14* (2010.01)
*F02G 5/04* (2006.01)
*H01L 35/30* (2006.01)

(56) References Cited

U.S. PATENT DOCUMENTS

| | | | |
|---|---|---|---|
| 2012/0198841 A1* | 8/2012 | Sloss | F01N 3/046 |
| | | | 60/605.1 |
| 2012/0204557 A1* | 8/2012 | Jebasinski | F01N 13/10 |
| | | | 60/605.1 |
| 2016/0064636 A1* | 3/2016 | Noh | H01L 35/30 |
| | | | 136/205 |
| 2016/0102592 A1 | 4/2016 | Kwak et al. | |

FOREIGN PATENT DOCUMENTS

| | | | |
|---|---|---|---|
| EP | 2489846 A1 | 8/2012 | |
| WO | WO 2011045659 A1 | 4/2011 | |

\* cited by examiner

APPARATUS FOR UTILIZING WASTE HEAT OF AN INTERNAL COMBUSTION ENGINE

CROSS REFERENCE TO RELATED APPLICATIONS

This application claims benefit to European Patent Application No. EP 17 209 969.9, filed Dec. 22, 2017, which is incorporated by reference herein.

FIELD

The invention relates to an apparatus with an exhaust gas manifold and a thermoelectric element for utilizing the waste heat of the internal combustion engine.

BACKGROUND

For increasing the power or the economical efficiency of a vehicle, it is known to use thermoelectric elements which utilize the waste heat of the internal combustion engine in order to generate additional energy. From the prior art, such elements are used for the most part in the field of exhaust systems. Such thermoelectric elements economically make sense but only when a high temperature difference exists between the one side of the element and the other side of the element since a voltage is generated as a result of it. A disadvantage of thermoelectric elements which are fastened in the exhaust region is that an excessively small temperature difference exists in order to achieve such an energy gain which economically makes sense.

US 2016/012592 A1 discloses a generator for an internal combustion engine, wherein a plurality of thermoelectric modules are arranged on a heat shield which covers the exhaust gas manifold.

SUMMARY

In an embodiment, the present invention provides an apparatus for utilizing waste heat of an internal combustion engine. The apparatus includes an exhaust gas manifold and a thermoelectric element. The thermoelectric element is configured to generate an electric voltage as a result of a temperature difference between a side facing away from the exhaust gas manifold and an opposite side. The thermoelectric element is arranged on the exhaust gas manifold. The apparatus additionally includes a cooling element arranged on the thermoelectric element on the side facing away from the exhaust gas manifold. The cooling element has at least one cooling passage configured to provide for the throughflow of a fluid.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
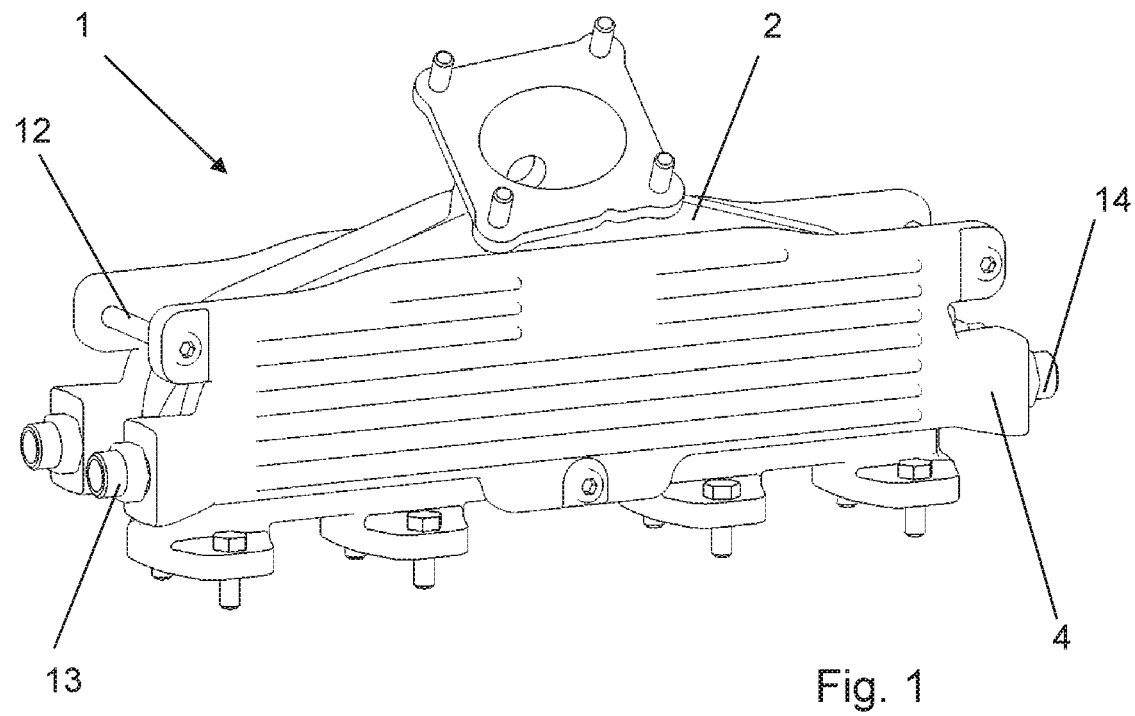
FIG. 1 shows a three-dimensional view of an exhaust gas manifold according to an embodiment of the invention with thermoelectric elements.

It is disadvantageous that the thermoelectric modules are not exposed directly to the action of the maximum temperature which prevails in the exhaust gas manifold but, as a result of the heat shield on which they are fastened, are isolated from the waste heat of the internal combustion engine and consequently no maximum temperature difference is achieved in the thermoelectric element between the side facing the engine and the side butting against the cooling element.

Embodiments of the invention provide an exhaust gas manifold with a thermoelectric element for utilizing the waste heat of the internal combustion engine, in which a large energy gain can be generated by way of the waste heat of the internal combustion engine and consequently an economical advantage is achieved.

Embodiments of the invention provide for a cooling element arranged on a thermoelectric element on a side facing away from an exhaust gas manifold, wherein the cooling element has at least one cooling passage, wherein the cooling passage serves for the throughflow of a fluid.

Embodiments of the present invention deal with an exhaust gas manifold with at least one thermoelectric element for utilizing the waste heat of the internal combustion engine. Apparatuses according to embodiments of the invention preferably include a cast material, specifically by preference consisting of cast steel or cast iron, wherein an exhaust gas manifold consisting of sheet metal or other materials is also conceivable, and at least one thermoelectric element, wherein the thermoelectric element is preferably designed as a plate and the thermoelectric element creates an electric voltage as a result of the occurring temperature difference between the one side of the plate and the opposite side of the plate, wherein the thermoelectric element can also have different constructional forms to plates. At least one thermoelectric element is arranged on the exhaust gas manifold side, wherein to be understood by exhaust gas manifold side are the outer sides such as upper side and lower side of the exhaust gas manifold as well as the front side which connects the upper side and lower side and is preferably designed as a radius. Arranged on each thermoelectric element on the side facing away from the exhaust gas manifold is a cooling element, wherein the cooling element has at least one cooling passage, wherein the cooling passage serves for the throughflow of a fluid. By attaching cooling elements on the thermoelectric elements on their sides facing away from the exhaust gas manifold a very large temperature difference is achieved, which serves for creating a high voltage.

It is advantageous if the exhaust gas manifold and the cooling element are designed as separate parts. This also enables the separate production of the exhaust gas manifold and the cooling element, and also enables the possibility of using different materials which are specifically adapted to the requirements. Due to the fact that the parts are not interconnected or not designed as one part, the effect of a thermal bridge arising, in which the heat of the exhaust gas manifold transfers to the cooling element, can be avoided.

A cooling element preferably extends over the complete width of an exhaust gas manifold side, that is to say preferably over the complete width of the exhaust gas manifold upper side and/or the exhaust gas manifold lower side and/or the exhaust gas manifold front side, by which it is to be understood that the cooling element extends over all exhaust gas inlets.

A cooling element preferably also extends over the complete length of an exhaust gas manifold side, preferably the exhaust gas manifold upper side and/or the exhaust gas manifold lower side, that is to say along the exhaust gas inlets right up to the exhaust stub in which the exhaust gas inlets come together. This brings an optimum utilization of the available surface of the exhaust gas manifold. The cooling element(s) is/are preferably designed as a single-piece element which continues over the complete width and length. Consequently, unnecessary separation points, which do not result in optimum surface utilization, are avoided, and the fastening on the exhaust gas manifold becomes simpler.

As a further preferred embodiment, a thermoelectric element is also arranged on the front side which connects the exhaust gas manifold upper side and lower side and is preferably designed as a radius, wherein a cooling element also butts against the side facing away from the exhaust gas manifold. As a result of this, the surface of the exhaust gas manifold is optimally utilized.

The cooling element is preferably designed as a cast part, wherein the cooling element is specifically by preference designed as an aluminium or magnesium pressure die-cast part.

As a possible further embodiment, the cooling element can also be designed as a milled part or sheet metal part, wherein it is then formed by two half-shells in order to introduce the cooling passage, which half-shells are then assembled to form a cooling element which preferably includes a seal in order to seal the half-shells in relation to each other.

It is advantageous if the cooling element butts on one side directly against the thermoelectric element or the surfaces of the cooling element are in contact with the surface of the thermoelectric element without a further element or material being arranged in between. As a result, the thermoelectric element is optimally cooled on the side of the cooling element and consequently experiences a large temperature difference between the two sides of the thermoelectric element.

In order to achieve a temperature difference which is as large possible between the two sides of the thermoelectric element, as mentioned above, at least one thermoelectric element or one side of it butts directly against an exhaust gas manifold side. Preferably, a thermoelectric element butts by its side directly against the outer surface of the exhaust gas manifold lower side and/or the exhaust gas manifold upper side and/or the exhaust gas manifold front side or a preferably continuous thermoelectric element is arranged exclusively on the respective side, this ensuring an optimum utilization of the heating surface of the exhaust gas manifold.

As an alternative embodiment, a filling element is arranged between the outer surface of the exhaust gas manifold side and the thermoelectric element. The filling element is preferably arranged between the surface of the exhaust gas manifold lower side and/or the outer surface of the exhaust gas manifold upper side and the thermoelectric element. The filling element is produced from a material with good conductivity so that the heat of the exhaust gas manifold is transferred without losses as far as possible to the thermoelectric element. It serves chiefly for simpler fastening of the thermoelectric element or of the cooling element on the exhaust gas manifold.

As a preferred embodiment, it has been shown that the thermoelectric element is fastened on the cooling element, preferably by means of a fastening means. As a result, a pre-assembled module, which can be fastened on the exhaust gas manifold in a simple manner, can be formed.

FIG. 1 shows a three-dimensional view of an exhaust gas manifold according to an embodiment of the invention with thermoelectric elements 1.

The illustrated embodiments show variants in which the thermoelectric elements and the cooling elements are attached on two sides, that is to say at the bottom and top of the exhaust gas manifold, but a possible embodiment of an exhaust gas manifold according to the invention which has the elements only at the bottom or only at the top, as well as only on the front side or on all sides, that is to say at the top, bottom and on the front side, is naturally also conceivable.

In the depicted embodiment in FIG. 1, the cooling elements 4 are fastened on the exhaust gas manifold 2 with the aid of fastening means 12, wherein in the depicted embodiment the cooling elements 4 which are arranged one on the exhaust gas manifold upper side 5 and one on the exhaust gas manifold lower side 6 respectively are clamped together. Naturally, other arrangements and fastening elements for the fastening of the cooling elements 4 on the exhaust gas manifold 2 are also conceivable. The thermoelectric elements 3 are arranged between the cooling elements 4 and the exhaust gas manifold upper side 5 and also between the other cooling element 4 and the exhaust gas manifold lower side 6 and are evident in FIGS. 3-5. The cooling elements 4 have at least one cooling passage 9 in their interior, shown in FIGS. 4 and 5, through which flows a fluid and therefore the cooling element 4 is cooled. The inlet and outlet openings 13, 14 are preferably located on the end faces of the cooling elements 4. The cooling elements 4 are designed as separate parts, which is easy to see in FIGS. 4 and 5. As a result, the exhaust gas manifold 2, as well as the cooling elements 4, can be produced in each case from another material which best corresponds to the requirements.

Figure 2:
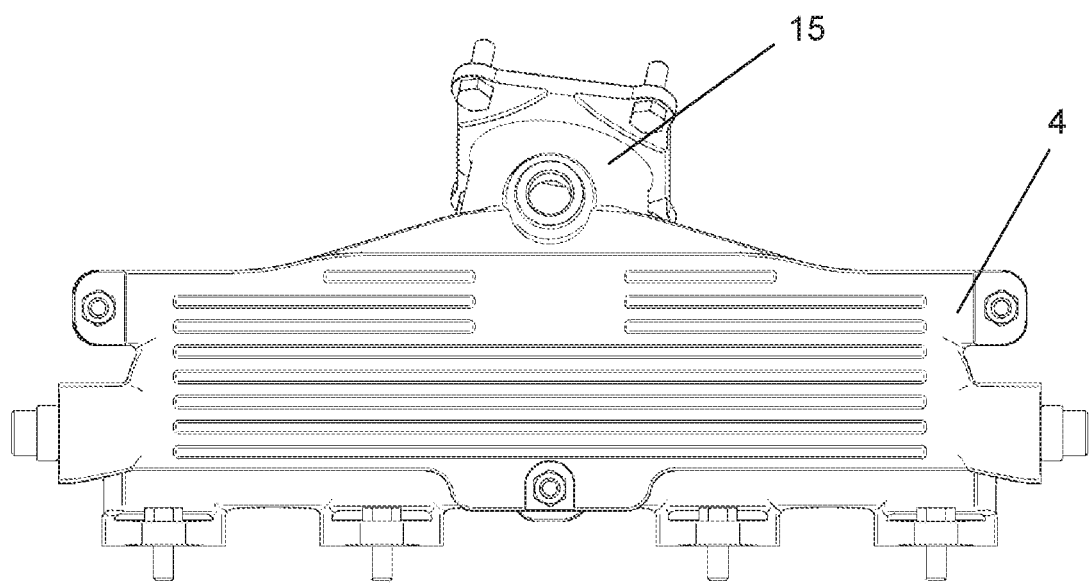
FIG. 2 shows a plan view of an exhaust gas manifold according to an embodiment of the invention with thermoelectric elements.

FIG. 2 shows the exhaust gas manifold according to an embodiment of the invention with thermoelectric elements 1 in a plan view, therefore the cooling element 4, which is arranged on the exhaust gas manifold upper side 5, is mainly visible here. It is also easy to see that the cooling element 4 extends over the complete width of the exhaust gas manifold 2, that is to say over all the exhaust gas inlets and also over the length of the exhaust gas manifold which corresponds approximately to the length of the exhaust gas inlets right up to the exhaust stub 15 in order to therefore optimally utilize the available surface and consequently no unnecessary separation points of individual cooling elements 4 exist.

Figure 3:
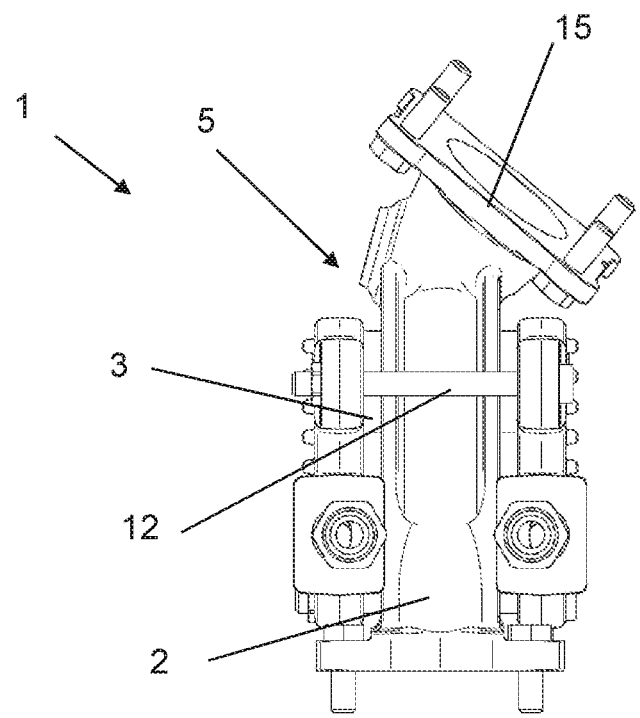
FIG. 3 shows a side view of an exhaust gas manifold according to an embodiment of the invention with thermoelectric elements.

FIG. 3 shows an exhaust gas manifold according to an embodiment of the invention with thermoelectric elements 1 in a side view. The thermoelectric elements 3, which are arranged between the exhaust gas manifold upper side 5 and a cooling element 4 and also between the exhaust gas manifold lower side 6 and a further cooling element 4, are clearly to be seen. In the embodiment depicted in FIG. 3, the cooling elements 4 are pressed onto the exhaust gas manifold 2 by means of a fastening means 12, but there are innumerable variants for this for fastening the cooling elements 4 on the exhaust gas manifold 2, wherein the thermoelectric elements 3 are still arranged or clamped in between.

Figure 4:
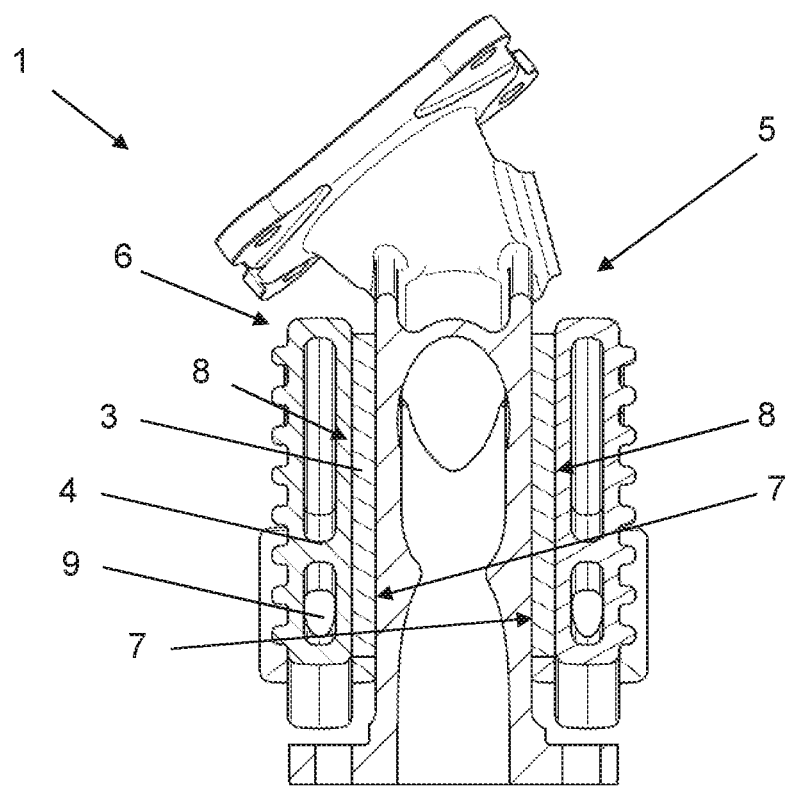
FIG. 4 shows a sectional view of an exhaust gas manifold according to an embodiment of the invention with thermoelectric elements.

FIG. 4 shows an exhaust gas manifold according to an embodiment of the invention with thermoelectric elements 1 in a sectional view. It is easy to see here that the two thermoelectric elements 3 butt against the exhaust gas manifold upper side 5 and exhaust gas manifold lower side 6. The cooling element 4 butts against the side 8 of the thermoelectric element 3 which faces away from the exhaust gas manifold. Due to the fact that the thermoelectric element 3 on the one side 7 butts against the hot exhaust gas manifold 2 and the other side 8 butts against the cool cooling element 4, a high voltage, which can be utilized as energy, is generated. Visible in FIGS. 4 and 5 is the cooling passage 9 of the cooling element 4, wherein the cooling element 4 is preferably designed as a cast part, but a production as a milled part which is formed by two half-shells which are assembled together by means of a seal, forming a cooling element 4 (not shown), is also conceivable.

Figure 5:
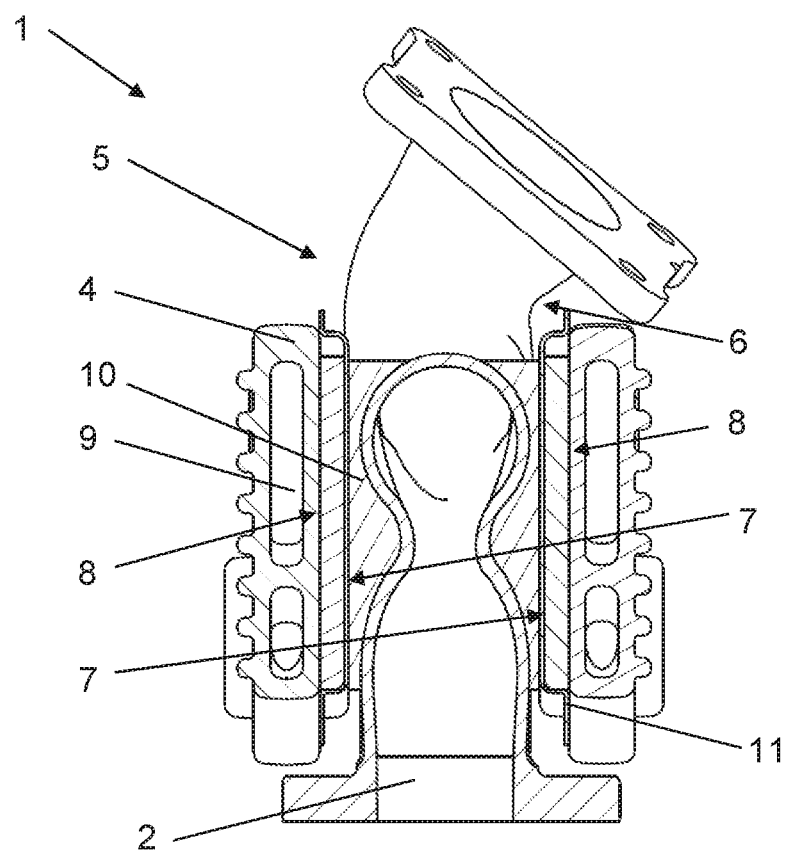
FIG. 5 shows a sectional view of an exhaust gas manifold according to an embodiment of the invention with thermoelectric elements with a filling element.

FIG. 5 shows a further embodiment of an exhaust gas manifold with thermoelectric elements 1, wherein the thermoelectric element 3 is fastened on the cooling element 4 by means of a fastening means 11 so that an installation module, which can be pre-assembled and fastened on the exhaust gas manifold 2 in a simple manner, is formed.

Furthermore, FIG. 5 also shows the possibility of a filling element 10 which optimizes the abutment of the thermoelectric element 3 against the exhaust gas manifold 2 or forms a seat. The filling element 10 preferably features a very conductive material so that the heat of the exhaust gas manifold 2 can easily be directed onto the side 7 of the thermoelectric element 3 and so that a large temperature difference exists between the side 7 facing the exhaust gas manifold and the side 8 facing the cooling element. Naturally, a filling element 10 can also be used if no fastening means 11 exist for the pre-assembly of an installation module and such a pre-assembled installation module can also be arranged on the exhaust gas manifold 2 without a filling element 10.

Figure 6:
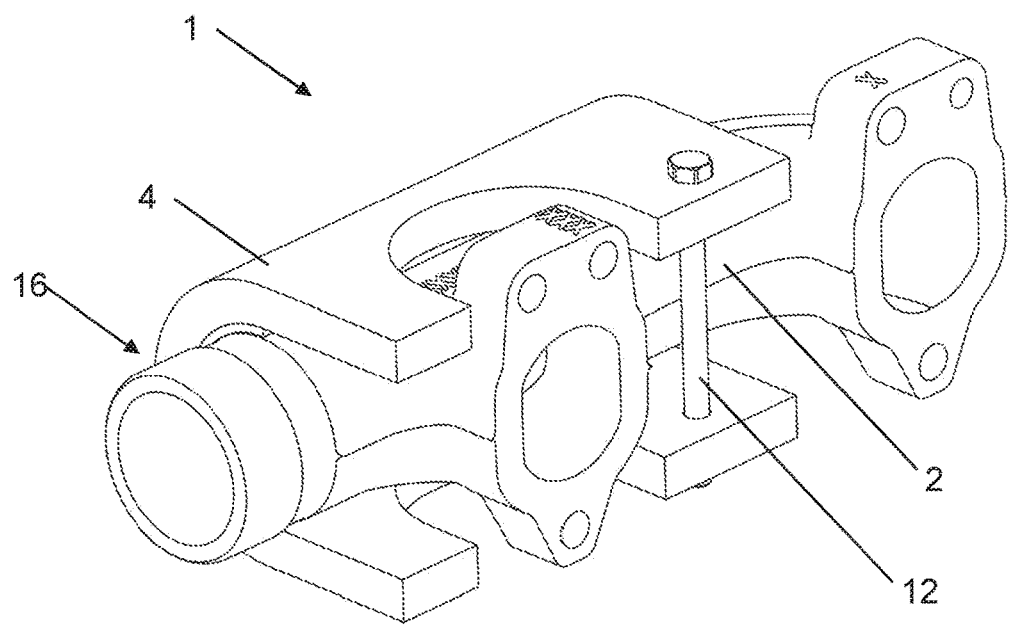
FIG. 6 shows a three-dimensional view of an exhaust gas manifold according to an embodiment of the invention with thermoelectric elements on the front side.
Figure 7:
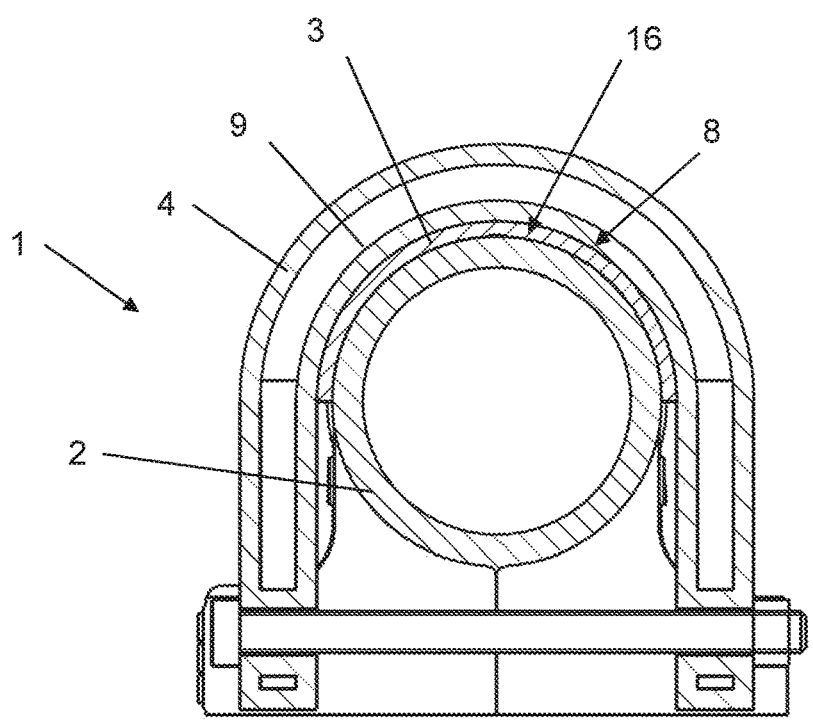
FIG. 7 shows a sectional view of an exhaust gas manifold according to an embodiment of the invention with a thermoelectric element on the front side.

Illustrated in FIGS. 6 and 7 is a further exemplary embodiment of the exhaust gas manifold 1 according to an embodiment of the invention. It can be easily seed therein that a thermoelectric element 3 butts against the exhaust gas manifold side 16, or against the front side 16 of the exhaust gas manifold, and a cooling element 4 butts against the side 8 of the thermoelectric element 3 facing away from the exhaust gas manifold. Naturally, a combination of the thermoelectric elements 3 and the cooling elements 4 of different embodiments is also conceivable.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Exhaust gas manifold with thermoelectric element
2 Exhaust gas manifold
3 Thermoelectric element
4 Cooling element
5 Exhaust gas manifold side (upper)
6 Exhaust gas manifold side (lower)
7 Side of thermoelectric element facing/butting against the exhaust gas manifold
8 Side of thermoelectric element facing away from the exhaust gas manifold/butting against the cooling element
9 Cooling passage
10 Filling element
11 Fastening means
12 Fastening element
13 Cooling passage inlet
14 Cooling passage outlet
15 Exhaust stub
16 Exhaust gas manifold side (front side)

The invention claimed is:

1. An apparatus for utilizing waste heat of an internal combustion engine, the apparatus comprising:
an exhaust gas manifold;
a cooling element, the cooling element being a casting that is separate from the exhaust gas manifold, the casting having at least one cooling passage in an interior thereof configured to provide for throughflow of a fluid; and
a thermoelectric element configured to generate an electric voltage as a result of a temperature difference between a side of the thermoelectric element facing away from the exhaust gas manifold and an opposite side of the thermoelectric element facing the exhaust gas manifold,
wherein the thermoelectric element is arranged on the exhaust gas manifold, and
wherein the cooling element is arranged on the side of the thermoelectric element en facing away from the exhaust gas manifold.

2. The apparatus according to claim 1, wherein the cooling element extends over the complete width of the exhaust gas manifold.

3. The apparatus according to claim 1, wherein the cooling element abuts directly against the thermoelectric element on one side in order to achieve direct cooling.

4. The apparatus according to claim 1, wherein the thermoelectric element abuts directly against the exhaust gas manifold or against its outer surface.

5. The apparatus according to claim 1, wherein a filling element is arranged between an outer surface of the exhaust gas manifold and the thermoelectric element.

6. The apparatus according to claim 1, wherein the thermoelectric element is arranged on an upper side of the exhaust gas manifold and wherein a second thermoelectric element is arranged on a lower side of the exhaust gas manifold.

7. The apparatus according to claim 1, wherein the thermoelectric element is arranged on a front side of the exhaust gas manifold.

8. The apparatus according to claim 1, wherein the thermoelectric element is fastened on the cooling element.

9. The apparatus according to claim 1, wherein the exhaust gas manifold includes a cast material.

10. The apparatus according to claim 1, wherein the at least one thermoelectric element is designed as a plate.

11. The apparatus according to claim 4, wherein the thermoelectric element is arranged exclusively on the exhaust gas manifold, and wherein the thermoelectric element is designed as a continuous part.

12. The apparatus according to claim 8, wherein the thermoelectric element is fastened on the cooling element by a fastener.

13. The apparatus according to claim 1, wherein the exhaust gas manifold is a second casting.

14. The apparatus according to claim 13, wherein the casting is an aluminum or magnesium casting, and wherein the second casting is a casting that comprises iron.

15. The apparatus according to claim 14, wherein the second casting is a steel casting.

16. The apparatus according to claim 13, wherein the side of the thermoelectric element facing away from the exhaust gas manifold contacts an exterior surface of the casting.

17. The apparatus according to claim 16, wherein the thermoelectric element is fastened on the casting.

18. The apparatus according to claim 16, wherein the side of the thermoelectric element facing the exhaust gas manifold contacts (i) an exterior surface of the exhaust gas manifold and/or (ii) a filling element arranged on an exterior surface of the exhaust gas manifold.

* * * * *